United States Patent [19]
Lindstrom et al.

[11] 3,955,038

[45] *May 4, 1976

[54] HARD METAL BODY

[75] Inventors: Jan Nils Lindstrom, Hagersten; Bo Folke Jonsson, Huddinge; Fall Johan Olof William Ohlsson, Enskede, all of Sweden

[73] Assignee: Sandvik Aktiebolag, Sandviken, Sweden

[ * ] Notice: The portion of the term of this patent subsequent to Sept. 24, 1991, has been disclaimed.

[22] Filed: Apr. 9, 1973

[21] Appl. No.: 349,125

[52] U.S. Cl. ............................... 428/457; 29/182.2; 29/182.7; 29/195; 427/248; 427/249; 427/419; 428/539

[51] Int. Cl.² ................. C23C 11/14; C23C 13/02; C23D 5/00

[58] Field of Search .................. 117/69, 106 C, 121, 117/127, 135.1, 46 CG; 30/343.53, 343.54; 148/126, 31.5; 29/195, 182.2, 182.7; 428/457, 539; 427/248, 249, 419

[56] References Cited
UNITED STATES PATENTS

| | | | |
|---|---|---|---|
| 2,872,350 | 2/1959 | Homer et al. | 117/106 C |
| 2,994,124 | 8/1961 | Denny et al. | 29/195 M |
| 3,249,460 | 5/1966 | Gerry | 117/70 B |
| 3,260,579 | 7/1966 | Scales | 29/195 A |
| 3,313,605 | 4/1967 | Gill | 29/195 A |
| 3,475,161 | 10/1969 | Ramivez | 117/69 |
| 3,640,689 | 2/1972 | Glaski et al. | 117/106 C |
| 3,719,519 | 3/1973 | Perugini | 117/69 |
| 3,721,577 | 3/1973 | Woerner | 117/106 C |

*Primary Examiner*—Ralph Husack
*Attorney, Agent, or Firm*—Pierce, Scheffler & Parker

[57] ABSTRACT

A sintered hard metal body is provided with a thin wear-resistant surface coating consisting of an outer layer of ceramic oxide and an intermediate layer of carbide or/and nitride.

2 Claims, No Drawings

HARD METAL BODY

This invention relates to the "hard metal" art, and is concerned with the provision of new and improved sintered hard metal bodies consisting essentially of particles of refractory metal carbide cemented together with binder metal.

In our patent application Ser. No. 303,362, filed Nov. 3, 1972, (now U.S. Pat. No. 3,837,896) there is described a sintered hard metal body, coated with a thin and extremely wear resistant surface layer. The surface coating consists of an outer layer of oxide, which overlies an inner, intermediate, layer of different material, which intermediate layer has been produced upon the surface of the substrate, i.e. the hard metal body, before applying the oxide layer.

It has been found that such coated hard metal bodies as for example cutting tools or inserts can reach considerable improvements of properties, compared to earlier known types of coated cutting tools as well as common uncoated hard metal inserts, if the thin coating consists of two layers applied one above the other, neither of the layers containing binder metal, the outer layer consisting of one or more layers of extremely wear-resistant oxides, while the inner layer, being next to the cutting body, per se, consists of one of more layers of one or more carbides and/or nitrides. Materials which have been found particularly suitable for producing such surface coatings are among the oxides: aluminum oxide and zirconium oxide, whilst among the other mentioned hard substances forming the intermediate layer are carbides and nitrides of Ti, Zr, Hf, V, Nb, Ta, Cr, Mo, W, Si and/or B, i.e. except Si and B metals in the 4th-6th subgroups of the periodic system.

One of the explanations of the improved results obtained in hard metal bodies according to the mentioned invention, seems to be that the intermediate layer impedes diffusion of binder metal (e.g., especially Co) from the hard metal substrate into the formed oxide layer. A considerable obstruction of the diffusion of carbon from the substrate is also attained. Because Co and/or C from the hard metal substrate have a harmfully catalyzing effect in the formation and growth of the oxide layer, the role of the intermediate layer as a diffusion barrier is a very important factor in this connection.

It has been found, that the method of using or producing an intermediate barrier layer upon the substrate can successfully be applied in coating hard metal with various wear-resistant ceramic oxide layers. Among oxides, except $Al_2O_3$ and $ZrO_2$, which have been found suitable for application upon an intermediate layer of the described kind, there can particularly be mentioned oxides of Si, B, Ca, Mg, Ti and/or Hf. Such layers may also be applied in combination, or above each other, depending upon different demands or possibilities. Furthermore, it has been noticed that also very thin oxide layers, which have been applied upon barrier layers of nitride or carbide type, give a great improvement of the wear resistance as well as maintained toughness. A favorable effect has been obtained with a layer thickness of only 0.2 μm, while the optimum thickness of the layer has often been found to be 0.5-4 μm. It has been found advantageous to regulate the ratio between the thickness of the intermediate layer and that of the outer layer inside certain limits. The thickness of the intermediate layer should thus be 2-16 times, and preferably 4-8 times, greater than the thickness of the outer (surface) layer. The total layer thickness (i.e. of the intermediate layer plus the outer layer) should be 3-11 μm, preferably 4-8 μm). The oxide layer should thus be relatively thin because the material itself is very brittle. Yet the thin oxide layer has an excellent resistance to chemical attack of various kind. The intermediate carbide or nitride layer, on the other hand, acts as an outstanding base which has many "intermediate properties" in relation to the properties of the substrate and those of the oxide layer. It provides the necessary toughness in certain uses, as for example many cutting operations, and may stop cracking and other unfavorable effects.

The following example shows coating with oxide of silicon.

SPECIFIC EXAMPLE

Coating with surface layer was performed in a reactor whose essential parts were made of a nickel base alloy known as "inconel". The coating included 3000 sintered hard metal cutting inserts in a grade containing about 40% (by volume) WC, 15% Co and 45% cubic carbides in the form of TiC, TaC and NbC (and possibly ZrC). They were placed upon strainer-like plates providing good contact with the surrounding gas.

At first, an intermediate layer of TiC was applied by supplying a gas containing 10% $TiCl_4$, 8% $CH_4$ and 82% $H_2$ in a single conduit, the gas being manufactured in a manner known per se. The pressure in the reactor was maintained at 15 torr by sucking out the gas from the reaction vessel by means of a vacuum pump protected from corrosive reaction products (for instance HCl) by the help of a cooling trap with liquid nitrogen situated in the line before the pump. In this way a linear gas flow rate of 1 m/sec. was obtained in the charge. The treatment went on for 2 hours. As a result fine-grained, non-porous layers of TiC were obtained which had a thickness of about 2 μm.

In a separate, second, step the hard metal plates were treated in a corresponding equipment in which the gas supply system had been modified, however, so that a gas with the composition 70% $H_2$, 5% $CO_2$, 20% CO and 5% $SiCl_4$ could be dosed. The temperature of the substrate was 1100°C., and the pressure was 15 torr. A linear gas flow rate of 3.5 m/sec. was used. After a coating time of 3 hours, 2 μm thick layers of $SiO_2$ had been formed. The bond (i.e., adherence) of the $SiO_2$ layer to the intermediate TiC layer was very good.

We claim:
1. An article consisting of
   1. a substrate body of sintered cemented metal carbide containing a small quantity of binder metal;
   2. an intermediate layer of metal selected from the group consisting of metal carbides and metal nitrides; and
   3. a thin wear-resistant surface coating consisting essentially of at least one layer of wear-resistant ceramic oxide,
   the thickness of said surface coating being 0.5–4.0 μm, and the thickness of said intermediate layer being 2–16 times that of said surface coating.
2. An article as defined in claim 1 in which the sum of the thickness of the intermediate layer and the surface coating is 3–11 μm.

* * * * *